(12) United States Patent
Mehring

(10) Patent No.: US 9,247,672 B2
(45) Date of Patent: Jan. 26, 2016

(54) PASSIVELY CONTROLLED SMART MICROJET COOLING ARRAY

(71) Applicant: Parker-Hannifin Corporation, Cleveland, OH (US)

(72) Inventor: Carsten Mehring, Irvine, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 262 days.

(21) Appl. No.: 14/159,016

(22) Filed: Jan. 20, 2014

(65) Prior Publication Data

US 2014/0204532 A1    Jul. 24, 2014

Related U.S. Application Data

(60) Provisional application No. 61/754,775, filed on Jan. 21, 2013.

(51) Int. Cl.
*H05K 7/20*    (2006.01)
*H01L 23/473*    (2006.01)

(52) U.S. Cl.
CPC .............. *H05K 7/20* (2013.01); *H01L 23/4735* (2013.01); *H05K 7/20136* (2013.01); *H05K 7/20345* (2013.01); *H01L 2224/16225* (2013.01); *H01L 2924/0002* (2013.01); *H01L 2924/15311* (2013.01); *H01L 2924/16152* (2013.01)

(58) Field of Classification Search
USPC ......................................... 361/689, 690, 692
IPC ........................................................ H05K 7/20
See application file for complete search history.

(56) References Cited

U.S. PATENT DOCUMENTS

| 5,063,476 | A | * | 11/1991 | Hamadah | H01L 23/467 257/E23.099 |
| 5,294,830 | A | * | 3/1994 | Young | H01L 23/4338 165/80.4 |
| 5,380,470 | A | * | 1/1995 | Jacobsson | F16K 47/04 261/16 |
| 7,336,486 | B2 | | 2/2008 | Mongia | |
| 8,132,616 | B1 | | 3/2012 | Brower et al. | |
| 2009/0200007 | A1 | | 8/2009 | Foy et al. | |
| 2009/0314467 | A1 | * | 12/2009 | Campbell | H01L 23/4735 165/80.4 |
| 2010/0034638 | A1 | * | 2/2010 | Chambers | F01D 5/187 415/115 |

(Continued)

FOREIGN PATENT DOCUMENTS

JP    7-94881    4/1995

*Primary Examiner* — David Warren
(74) *Attorney, Agent, or Firm* — Renner, Otto, Boisselle & Sklar, LLP

(57) ABSTRACT

An impingement cooling system for cooling electronic components includes a nozzle array having a plurality of nozzles in fluid communication with a source of cooling fluid, each nozzle including a deflection structure that deforms above a threshold temperature. A plurality of thermally conductive pins respectively are in thermal contact with the deflection structures and conduct heat from at least one of the electronic components to the deflection structures. When a heated nozzle within the nozzle array reaches a temperature above the threshold temperature due to heat conducted from the respective thermally conductive pin, the deflection structure of the heated nozzle deforms from a closed position to an open position to permit cooling fluid to impinge upon the electronic component. The deflection structure may be a deflection plate formed of a bimetallic material having layers of different thermal expansion coefficients, or a thermally responsive two-way shape memory material.

26 Claims, 9 Drawing Sheets

(56) References Cited

U.S. PATENT DOCUMENTS

| | | | |
|---|---|---|---|
| 2010/0258270 A1 | 10/2010 | Arik et al. | |
| 2010/0328882 A1* | 12/2010 | Campbell | H01L 23/427 361/689 |
| 2010/0328888 A1* | 12/2010 | Campbell | H01L 23/4735 361/699 |
| 2013/0000309 A1* | 1/2013 | Dierberger | F23R 3/002 60/752 |
| 2013/0031914 A1* | 2/2013 | Lee | F01D 5/186 60/806 |
| 2014/0076523 A1* | 3/2014 | Batker Pritzker | H01L 23/473 165/104.28 |
| 2014/0284787 A1* | 9/2014 | Joshi | H01L 23/4735 257/714 |
| 2015/0043164 A1* | 2/2015 | Joshi | G06F 1/20 361/699 |
| 2015/0118019 A1* | 4/2015 | Maurer | F01D 25/14 415/1 |

* cited by examiner

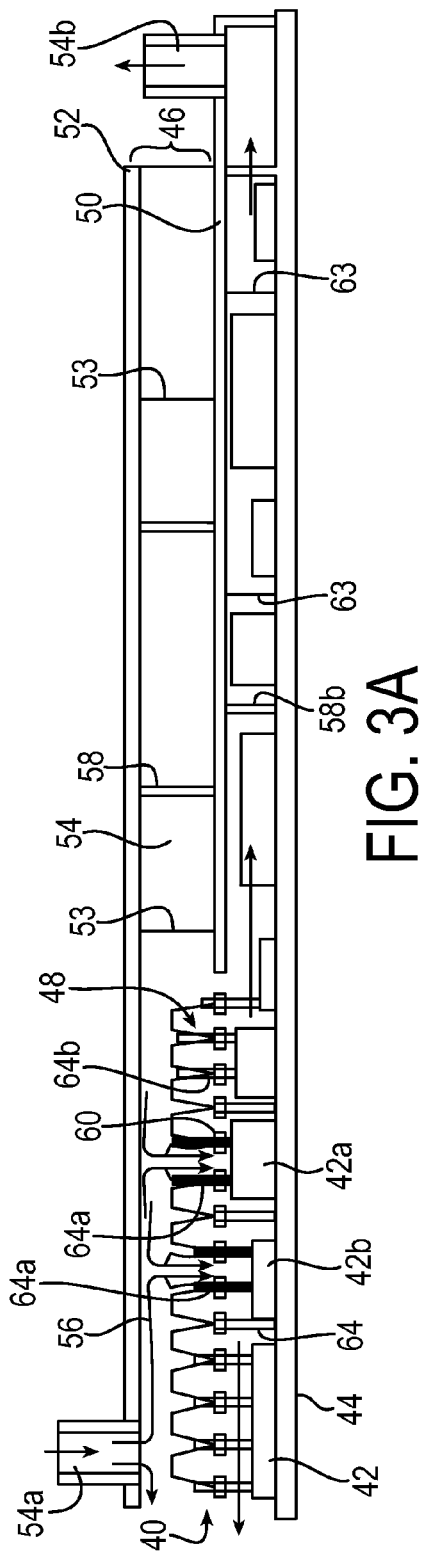
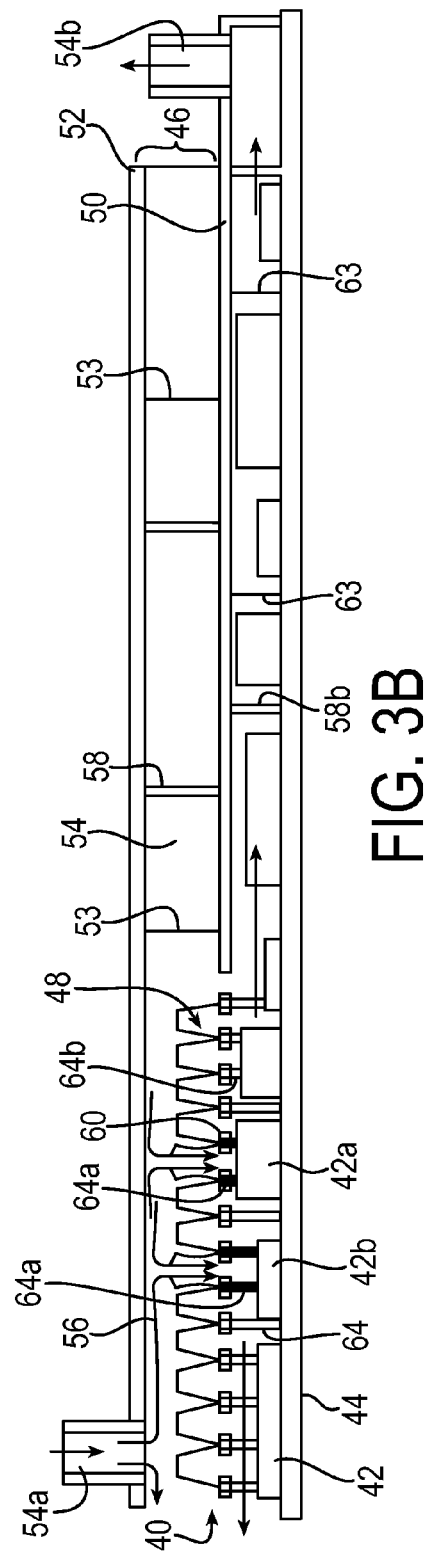

PASSIVELY CONTROLLED SMART MICROJET COOLING ARRAY

FIELD OF THE INVENTION

The present invention relates to impingement cooling arrays for electronic components, particularly electronic components fixed to an electronics circuit board, and more particularly to a passively controlled smart microjet impingement cooling array for cooling such electronic components.

BACKGROUND OF THE INVENTION

Cooling of electronics components can be achieved by impinging gas or liquid onto such components via gas jets, or mixed liquid/gas flows (i.e., liquid sprays in a surrounding gas phase). FIG. 1 is a schematic diagram that depicts a conventional cooling jet system for cooling electronic components, referenced collectively as the electronics system 10.

The electronics system 10 includes a plurality of electrical contacts 12 connecting a chip carrier circuit board 14 onto which electronic components may be fixed. An exemplary electronic chip 16 has its own set of electrical contacts 18 that plug into or are connected to the circuit board 14. A chip cap 20 may be provided to cover the circuit board 14 and the connected electronic chip 16, so as to isolate the chip to prevent contamination by outside dust, moisture, and other contaminants that may operate to undermine chip performance.

It will be appreciated that in operation, the electronic chip 16 generates a degree of heat, which if not dissipated can result in damage to, or even destruction of, the electronic chip and any other surrounding electronic components. Accordingly, a cooling system is provided. In the conventional configuration of FIG. 1, the cooling system includes an inlet 22 for providing a supply of cooling fluid, which may include a cooling liquid (e.g., water), a cooling gas (e.g., air), or a combined suitable liquid/gas mixture. The cooling fluid travels under pressure through a first manifold 24 to a jet plate 26 that has a plurality of jets 28. The jets 28 administer the cooling fluid to the surface of the chip to remove the heat generated by the chip. The cooling fluid is maintained within the area adjacent the chip by seals 29. The cooling fluid, now having drawn the heat from the electronic chip, is discharged under pressure from the electronic chip 16, through a second manifold 30 and out of an outlet 32.

Recent developments in such impingement cooling have focused on optimizing geometric and flow parameters to maximize cooling efficiencies obtainable with the general concept of impingement cooling. In addition, combinations of jet impingement with other cooling techniques (such as evaporative or thermo-electric cooling using the Peltier effect) have been investigated to further enhance cooling efficiencies. There have been attempts, therefore to optimize cooling efficiency by timed activation of rows and/or columns of jets within the cooling jet array for the purpose of driving a bulk motion in the jet discharge volume between a jet nozzle wall and a cooling surface. Timed activation has proven deficient, however, as being insufficiently related to actual temperature conditions. Under a timed activation, cooling fluid is discharged against the electronic components even when actual temperature conditions do not warrant cooling.

As an alternative to the timed activation control referenced above, which is imprecise in relation to actual temperature conditions, conventional impingement cooling systems have operated under active control. Such active control gathers sensory input pertaining to temperatures in the vicinity of different sections of the jet cooling array in such a way that cooling jets are only deployed or activated at positions where temporary hot spots occur on the electronics board. In particular, active controlled systems may involve logical electric circuits using temperature measurement via temperature sensors, signal transmission, controller processing and subsequent signal generation, and activation of piezo-electric orifices to open and close individual cooling jets or groups of cooling jets within the array. Active control systems, however, by employing sophisticated sensors and related control electronics, have proven deficient due to their complexity and implications for manufacturing, operation and maintenance.

SUMMARY OF THE INVENTION

In view of the above deficiencies of conventional impingement cooling systems for electronic components, there is a need in the art for an improved impingement cooling system. The present invention is a passively controlled, "smart" microjet cooling array, which provides for effective, focused and localized cooling for electronic components, without the use of complex sensors and control structures employed in conventional active control cooling systems.

The present invention includes an energy-efficient microjet array cooling system that provides for cooling of electronics boards and their associated electronic components. The cooling action is passively controlled in a manner that is limited in time and space only to sections of the circuit board or components that are beyond a certain temperature threshold. Cooling of the electronics components occurs by means of an impinging fluid, such as with gas jets or mixed liquid/gas flows (i.e., liquid sprays in a surrounding gas phase). The present invention provides a passively controlled system applied to the impinging jet array cooling concept, to achieve efficient spot cooling with broad area coverage and without the need to adjust cooling based on different thermal load distribution.

In exemplary embodiments, an impingement cooling system includes one or more fluid feed channels bounded by a top or cover plate, and an opposed injector plate containing a multitude of orifices or jet nozzles through which the cooling fluid is ejected. The jet nozzles direct the cooling fluid to impact on the electronics components situated under them, or alternatively, other surfaces which are in intimate thermal contact with the electronics components from which heat is to be removed. In general, the electronics components are mounted on a printed circuit board (PCB) or the like, or the electronic components may be mounted directly to another suitable static structure.

In embodiments of the present invention, the material forming a particular orifice or jet nozzle is in thermal contact with the electronics components below them (i.e., the electronics components onto which the jet discharging from them will impact). This thermal contact can be established by thermally conductive pins, comparable to so-called "vias" that facilitate heat transfer in PCB boards made of materials with high thermal conductivity. The material forming the orifice or jet nozzle or at least one of their respective parts is made of a shape memory alloy or polymer, or of bimetallic material or two composite materials with different thermal expansion coefficients, which change their shape based on localized temperature changes. For installation purposes, and before being locked in place, the thermally conductive pins may be mounted movably within the injector plate, hence allowing good thermal contact with the electronic components, the latter of which might have considerably different topology or heights.

The construction of the orifice or jet nozzle is such that the nozzle is closed below a certain threshold temperature $T_0$. As the electric component or PCB below a specific nozzle heats up, heat is transferred through the conductive pins onto the orifice/injector plate and then into or directly into the nozzle material. As the nozzle material or parts of it heat up beyond the $T_0$ threshold value, the jet nozzle or parts of it deform allowing for fluid to be ejected or discharged from the nozzle with fluid being replenished behind the nozzle through one or more fluid feed channels. As a consequence of the impinging fluid jet, the electronic component(s) and/or PCB portion below the specific nozzle cools down, reducing the heat transfer through the thermally conductive pins. In view of the cooling effect of the impinging cooling fluid, the heat transfer through the conductive pins is reduced or even reversed resulting in the localized nozzle temperature to fall back below the threshold temperature $T_0$. This results in closure of the previously opened nozzle until the electronic component(s) or PCB portion below the nozzle heats up again until the prescribed threshold value $T_0$ is reached again. Response time will depend on and can be controlled via the thermal resistance path between the deforming nozzle or nozzle elements and the component surface to be cooled; and the threshold temperature $T_0$ relates to a specific component surface temperature $T_s$ which is being controlled by the specific cooling nozzle. The prescribed cooling process repeats and ceases in a fully passive manner without the use of sensors and electronic control mechanisms utilized in conventional active control cooling systems. Rather, in the present invention the conductive pins merely serve to transmit heat without actually measuring the temperature level. The shape memory alloy or polymer, or bimetallic strip, opens the nozzle passively in response to localized temperature changes.

The present invention thus has advantages over conventional impingement cooling systems, and over active control impingement cool systems in particular. The system of the present invention is thermally and spatially closely coupled with the components to be cooled, i.e., heat transfer for temperature detection is facilitated via short thermally conductive pins communicating thermally between the target components to be cooled and the cooling nozzles, resulting in high spatial resolution. The small scale allows for a high level of integration between the fluid carrying feed channel(s) and the discharge nozzles. The low flow rates allow for a simple nozzle design with the nozzle material being constructed of a temperature-activated shape memory alloy metal/polymer/composite or bimetallic material or dual-layer material with dissimilar thermal expansion coefficients. The cheaply producible distributed array of nozzles and moveable pins allows a "one design fits all approach" making the system cost-effective without any or little customization needs.

The prescribed system is a cost efficient way to provide customized cooling solutions for a broad spectrum of electronics boards with very different geometric layouts or placement of the electronic components, or for electronics boards with identical hardware but different spatial distribution of thermal loads due to deployment for different electrical applications. Exemplary embodiments include jet arrays extending over an entire PCB and featuring a number of densely packed electronics components, smaller jet arrays covering only distinct specific electronics components, and jet arrays connected via separate fluid flow channels also may be employed.

An aspect of the invention, therefore, is an impingement cooling system for cooling electronic components on a circuit board. Another aspect of the invention is an electronics components system including a circuit board having at least one electronic component mounted thereon, and the referenced impingement cooling system.

In exemplary embodiments, the impingement cooling system includes a nozzle array including a plurality of nozzles that are in fluid communication with a source of cooling fluid, each nozzle comprising a at least one deflection structure that deforms above a threshold temperature. A plurality of thermally conductive pins respectively are in thermal contact with the deflection structures of the plurality of nozzles that conduct heat from at least one of the electronic components to the deflection structures of the nozzles. When a heated nozzle within the nozzle array reaches a temperature above the threshold temperature due to heat conducted from the respective thermally conductive pin to the deflection structure of the heated nozzle, the deflection structure of the heated nozzle deforms from a closed position to an open position to permit cooling fluid to impinge upon the at least one of the electronic components.

In exemplary embodiments, the deflection structures may be one or more deflection plate(s) formed of a bimetallic material or a dual-layer material composite including a first material layer having a first thermal expansion coefficient, and a second material layer having a second thermal expansion coefficient that is different from the first thermal expansion coefficient. The deflection plate deforms from the closed position to the open position as a result of the different thermal expansion coefficients of the two layers. In other exemplary embodiments, the deflection structure is a spiral deflection element of a shape memory alloy material. When heated above the threshold temperature, the spiral deflection element deforms about a center axis to rotate a connected extension plate from the closed position to the open position. It is understood to those skilled in the art designing thermally responsive structures that the system nozzles or pins can be designed to meet certain cooling needs or threshold temperature requirements. In fact, preselecting different nozzle types/materials and pin types/materials permits meeting different local temperature constrains of the PCB board or its components.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto.

Features that are described and/or illustrated with respect to one embodiment may be used in the same way or in a similar way in one or more other embodiments and/or in combination with or instead of the features of the other embodiments.

BRIEF DESCRIPTION OF DRAWINGS

FIGS. 3A-B are schematic diagrams that depict a side cross-sectional view of an electronics components system including an exemplary front side impingement jet cooling system for cooling electronic components on an electronic circuit board in accordance with embodiments of the present invention.

DETAILED DESCRIPTION

Figure 1:
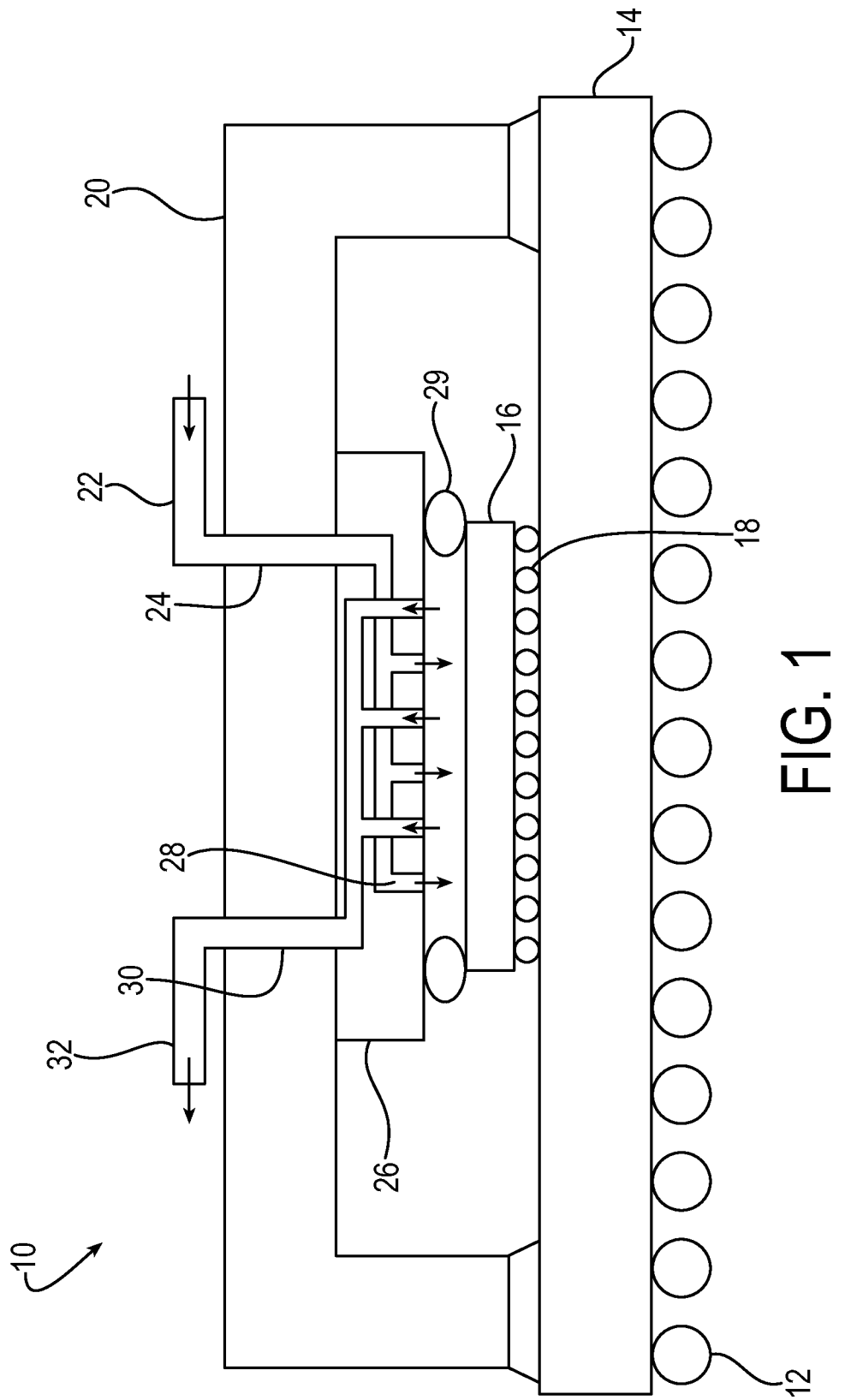
FIG. 1 is a schematic diagram that depicts a conventional impingement cooling jet system for cooling electronic components on an electronics circuit board.

Embodiments of the present invention will now be described with reference to the drawings, wherein like reference numerals are used to refer to like elements throughout. It will be understood that the figures are not necessarily to scale.

The passive nature of the described impingement cooling system is based in part on the nature of the thermal expansion of certain materials, which can result in deformation of the material as temperature changes. In exemplary embodiments, two different materials having different thermal expansions are adhered together as a bi-material strip. For example, the bi-material strip may be a bimetallic strip of two different metallic or polymer materials adhered to each other or otherwise fused together. Exemplary bimetallic materials that are known in the art include strips of brass and invar, steel and copper or steel and brass joined together by riveting, brazing or welding. Other thermostatic bimetals products are available commercially, e.g. from Kanthal AB (Sweden), In other embodiments, a single shape memory alloy material may be employed rather than a bimetallic strip. Suitable two-way shape memory alloy materials include Ni—Ti nickel-titanium alloy (also known as "Nitinol"), and copper-base alloys such as Cu—Al—Ni and Cu—Zn—Al which all exhibit the shape memory effect and which can recover substantial amounts of strain or that generate significant force upon changing shape. Suitable two-way (thermally-activated) shape memory polymers include cross-linked block copolymers such as polyesterurethane. Other shape memory polymers can be formed by utilizing thermoplastics, thermo-sets, semi-interpenetrating networks, or mixed networks of polymers as are known in the art.

Figure 2:
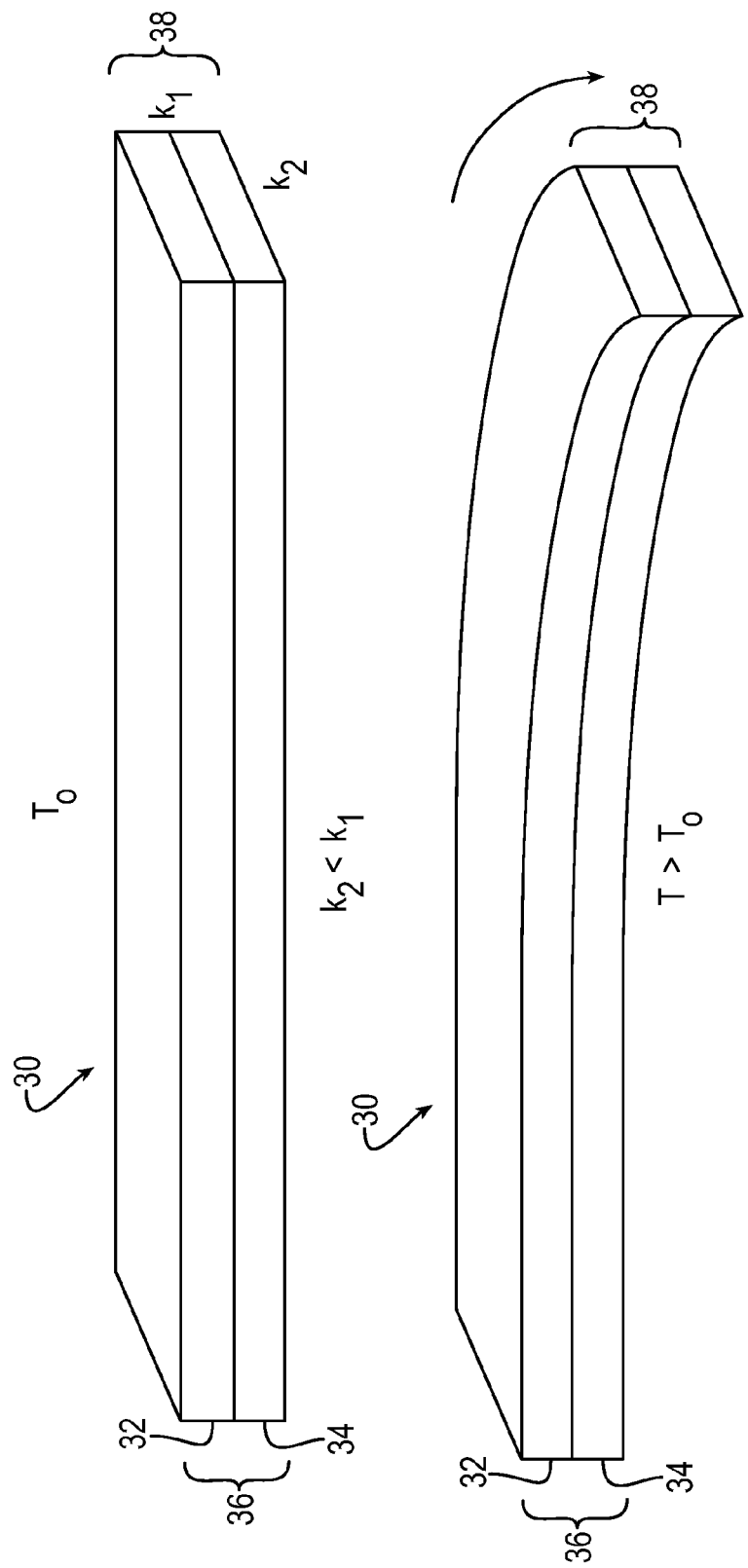
FIG. 2 is a schematic diagram depicting the principle of deformation of a bimetallic or dual-layer strip of two materials having different thermal expansion coefficients.

FIG. 2 is a schematic diagram depicting the principle of deformation of a bimetallic strip of materials having different thermal expansion coefficients. FIG. 2 depicts a bimetallic strip 30 including a first metallic layer 32 and a second metallic layer 34. The metallic layers are adhered or otherwise fused together to form the bimetallic strip 30 by processes that are known in the art. A first end 36 of the bimetallic strip 30 is fixed to a support structure (not shown), and a second end 38 of the bimetallic strip 30 is free to deform. The first metallic layer 32 has a first thermal expansion coefficient $k_1$, and the second metallic layer 34 has a second thermal expansion coefficient $k_2$ that differs from $k_1$. In this example, the first thermal expansion coefficient is higher than the second thermal expansion coefficient, $k_1 > k_2$, which results in the bending direction depicted in FIG. 2, although the relative nature of the thermal expansion coefficients can be reversed.

As depicted in FIG. 2, at a threshold temperature of $T_0$ or below, the metallic layers 32 and 34 are essentially congruent. As the materials are heated above $T_0$, the metallic layers begin to expand. Because of the different thermal expansion coefficients, the metallic layers 32 and 34 each expand at different rates, such that at a given temperature T above $T_0$, one of the metallic layers has expanded more than the other. In the example of FIG. 2, the first metallic layer 32 having the higher thermal expansion coefficient has expanded more than the second metallic layer 34, which causes the overall bimetallic strip 30 to deform as depicted. As described below, this or similar deformations induced by material temperature changes are utilized in the present invention to open and close impingement cooling jets in a localized area, and in a passive manner in response to localized temperature changes. As referenced above, a single shape memory alloy or polymer material may be employed rather than a bimetallic strip.

FIGS. 3A-B are schematic diagrams that depict a side cross-sectional view an electronics component system including an exemplary impingement jet cooling system 40 for cooling electronic components on an electronic circuit board in accordance with embodiments of the present invention. In this exemplary embodiment, cooling is provided from the top or front side of the electronic components. Electronic components 42 are mounted on a printed circuit board (PCB) 44. In use, the electronic components generate heat, which could damage the components and result in failure if not cooled. Such cooling is provided by the impingement jet cooling system 40.

The cooling system 40 includes an injector plate 46 that has a nozzle array 48 and an inner plate 50. The injector plate is capped by a cover plate 52 and spaced from the cover plate by wall structure 53 and support columns 58. The cover plate 52, the nozzle array 48 of the injector plate 46 and channel walls 53 define a fluid flow path 54. The fluid flow path 54 provides an inlet 54a for a cooling fluid that flows as represented by the streamlines 56. The cooling fluid may be any suitable cooling liquid or gas as are known in the art, which is provided under pressure to cool the electronic components. In an area where cooling might be needed, the inner plate 50 of the injector plate 46 includes a plurality of openings that form the lower portions of the nozzles, which permit fluid to flow through the fluid flow path 54 to impinge upon the electronic components 42 once the jet nozzles 60 are open to flow. The discharging cooling flow, shown moving to the left and right in FIGS. 3A-B between the inner plate 50 and the PCB board 44 after impingement, is guided by channel walls 63 and delivered through the outlet 54b. As the fluid is removed, heat is drawn away in such flow to cool the electronic components. The inner plate 50 with injector plate 46 and cover plate 52 are supported by the underlying channel walls 53 and 63 and by columns 58 and 58b.

The cooling system 40 further includes the following components. The nozzle array 48 includes a plurality of jet nozzles 60. Each jet nozzle 60 has at least one deflection structure 62 that deflects to open and close the nozzle. In exemplary embodiments, the deflection structure may be a deflection plate that deflects to open and close the nozzle. Each deflection plate/structure is in thermal contact with at least one thermally conductive pin 64. The thermally conductive pins 64 respectively are in contact with at least one of the electronic components 42 on the PCB. In this manner, the pins 64 conduct heat from the electronic components 42 to respective deflection plates/structures 62. To avoid heat loss and ensure adequate conduction between the electronic components and deflection plates/structures, the pins 64 may be formed of an inner thermally conductive metal material surrounded by an insulating layer that is non-conductive of heat. The temperature of the pins 64, therefore, will accurately be commensurate with the temperature of the respective contact electronic components 42.

In the example of FIGS. 3A-B, to represent significant heating, hotter pins 64*a* of the pins 64 are shown darkened relative to cooler pins 64*b* of the pins 64. In addition, the deflection plates or deflecting structures 62 are made at least partially of a material that deforms above a heat threshold, such as a bimetallic material described above with respect to FIG. 2. It is presumed in FIG. 3 that the darkened, hotter pins have achieved a temperature $T_1$ above the threshold temperature $T_0$ for deflection or deformation of the bimetallic material. Such high temperature may be achieved due to heating of the associated electronic components in thermal contact with the darkened pins 64*a*. As such, the heat of the electronic components is conducted through the darkened pins 64*a* to the respective deflection plates or deflecting structures 62, until the deflection plates/structures likewise achieve the higher temperature $T_1$. This causes the deflection plates/structures to deform, thereby opening the nozzle to permit fluid to flow from the fluid flow path 54 to impinge upon the heated electronic components.

Cooling fluid flowing through open nozzles impinges upon the heated electronic components. The continued flow of the cooling fluid away from the electronic components draws away the excess heat, thereby cooling the electronic components. When the electronic components achieve a cooled temperature below the threshold $T_0$, the thermally conductive pins 64*a* and associated deflection plates cool. The deflection plates then return to their original non-deformed configuration, thereby closing the nozzles.

Note that, for simplification purposes, the above discussion assumes zero thermal resistance (or infinite thermal conductivity) between the electronics components 42, conductive pins 64 and deflecting structures 62. Accordingly, all component temperatures are equal ($=T_1$) and are either above or below the threshold temperature $T_0$.

In the specific example of FIG. 3, two of the nozzles have opened in the above manner, specifically the two nozzles associated with the darkened pins 64*a*. In contrast, as represented by the lighter of the pins 64*b*, significant heating of such pins has not occurred to achieve a temperature above $T_0$. Accordingly, the respective deflection plates/structures associated with the lighter pins also remain at a temperature that has not achieved $T_0$, and thus have not deflected. The respective nozzles associated with the cooler pins 64*b*, therefore, are closed. In this manner, the impingement cooling of the system 40 is highly localized and efficient, delivering the cooling fluid only to electronic components that specifically are experiencing heating above the threshold temperature.

Furthermore in the example of FIGS. 3A-B, and during the initial installation process, the pins 64 are moveable relative to the inner plate 50 of the injector plate 46. As seen specifically in FIG. 3A, the electronic components 42 may be of different sizes and extend different heights above the PCB 44. Each pin 64 is moveable relative to the inner plate 50 to accommodate these height differences during the installation process and to ensure thermal contact with all electronic components regardless of size and height. For example, the pins 64 each may be slideably retained within an individual recess that extends through the inner plate 50. In this manner, when the inner plate 50 is positioned above the PCB, each pin 64 can slide perpendicularly (up or down) relative to the inner plate depending on the height of the associated electronic component 42.

For example, electronic component 42*b* extends a relatively small height as compared to electronic component 42*a*. Accordingly, to maintain the thermal contact the pins 64 associated with the electronic component 42*b* have slid downward relative to the inner plate 50 in a greater amount as compared to the pins associated with the electronic component 42*a*.

After placement of the inner plate 50 with contained pins, and the prescribed height adjustments, the pins can be locked in place. For example, prior to installation the pins could be super-cooled allowing them to fit through the recesses in the inner plate 50. After placement of pins 64 together within inner plate 50 above the PCB and height adjustment of the pins 64 to assure intimate contact with the one or more electronic component 42, the pins heat up thereby looking themselves in place with respect to the inner plate 50. After this initial adjustment, is desirable that the pins no longer extend into the fluid flow path. Accordingly, as shown in FIG. 3B, the excess pin material above the inner plate 50 can be removed, followed by installation of the injector plate 46, the channel walls 53, and the cover plate 52 resulting in the configuration specifically shown in FIG. 3B in which all the pins extend the same height and are cut off at the inner plate 50. To assure good thermal contact of the pins with the electronic components, thermal paste can be used at the end of the pins as well as tightening bolts instead of spacers 58*b*.

Figure 4A:
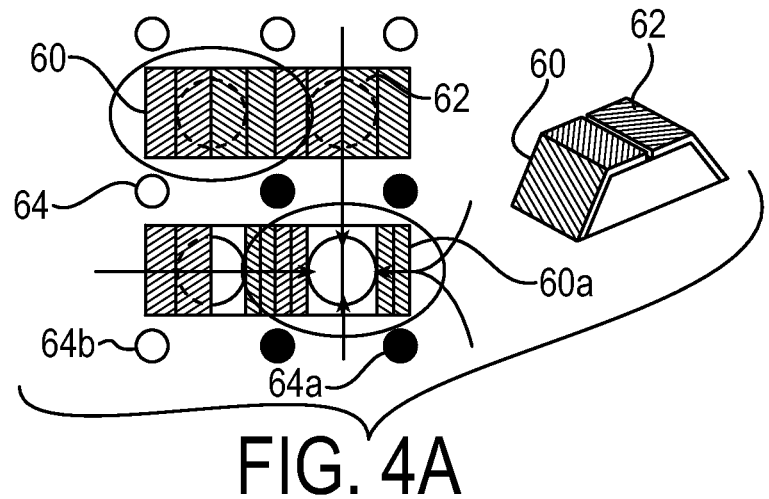
FIGS. 4A-B are schematic diagrams that depict top views of a portion of an exemplary nozzle array that is part of the system shown in FIG. 3 and that features two different nozzle types.
Figure 4B:
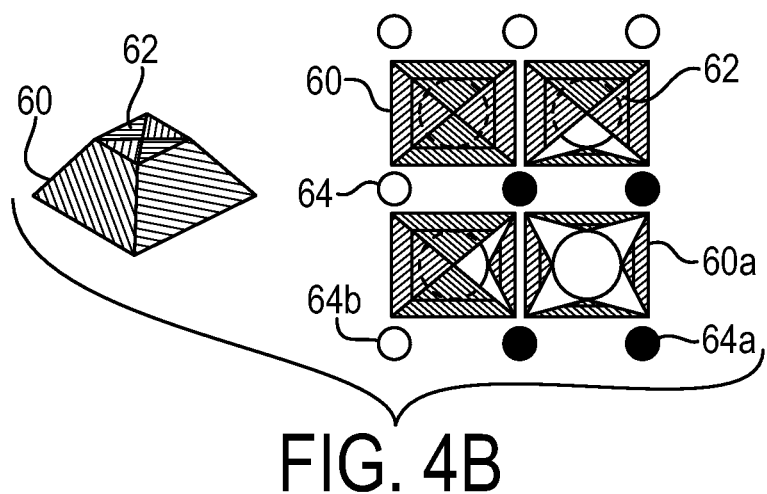

FIGS. 4A-B depict a top view of a portion of the nozzle array 48 from FIG. 3 having jet nozzles 60. FIG. 4A shows a jet nozzle with two deformable structures and FIG. 4B shows a jet nozzle with four deformable structures. It will be appreciated that the nozzle array may be any size and include as many nozzle or jet elements as appropriate for cooling a given set of electronic components. In the example of FIG. 4A, each nozzle includes two individual opposing rectangular deflecting structures 62 composed of two bent rectangular plates. It will be appreciated that the precise number and shape of the deformable structures may be varied.

Focusing now on the example in FIG. 4A, each nozzle 60 is in thermal contact with four pins 64. Adjacent nozzles commonly share thermal contact with two pins between such adjacent nozzles. Similarly as in FIG. 3, four pins 64*a* are darkened to represent the heating of such pins to a temperature $T_1$ above a threshold deflection temperature $T_0$. The lighter pins 64*b* represent pins that have not been heated above the threshold deflection temperature $T_0$. Nozzle 60*a* in particular is in thermal contact with four heated pins 64*a*. As such, nozzle 60*a* likewise has been heated to the temperature $T_1$, resulting in the deflection structure 62 of nozzle 60*a* deflecting or deforming to the open position. Cooling fluid can thus flow from the fluid flow path 54 (see FIG. 3), through the open nozzle 60*a* to impinge and cool an electronic component associated with and below the nozzle 60*a*. The other of the nozzles 60 of FIG. 4A, not being in thermal contact with a sufficient number of heated pins 64*a*, in turn have not been sufficiently heated to deform and therefore remain closed. The above discussion in context of FIG. 4A also applies to the nozzle design shown in FIG. 4B. However, the additional nozzle elements (i.e., 4 vs. 2 deformable structures) provides for enhanced spatial resolution in the top-to-bottom direction.

The described impingement cooling system of the present invention thus has advantages over conventional cooling systems. For example, the impingement cooling system is highly localized, delivering the cooling fluid only to those specific portions of the PCB for which the temperature has reached above the threshold. In addition, the localization is achieved passively in response to local temperature changes by the deflection of the associated heating of the nozzle materials, without the use of sensors and related control electronics or comparable active components. In addition, the thermally conductive pins are displaceable during the installation process, thereby providing a cooling system which is quickly customizable to different PCB boards with very broad size distribution of the electronics components to be cooled.

Figure 5:
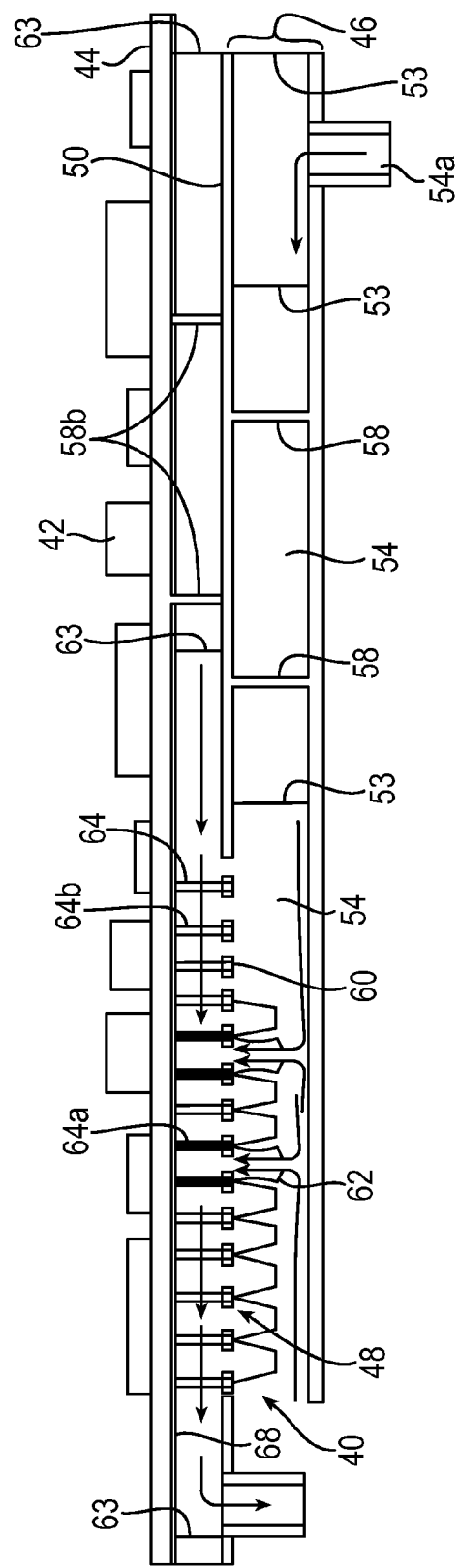
FIG. 5 is a schematic diagram that depicts a side cross-sectional view of an electronics component system including an exemplary back side impingement jet cooling system for cooling electronic components on an electronic circuit board in accordance with embodiments of the present invention.

As referenced above, FIG. 3 depicts a configuration by which the cooling system 40 cools from the front side of the PCB. An alternative configuration is depicted in FIG. 5, with like components being identified with the same reference numerals as in FIG. 3. FIG. 5 is a schematic diagram that depicts a side cross-sectional view of an electronics component system including an exemplary back side impingement jet cooling system 40 for cooling electronic components on the PCB. In such embodiment, a back side of the PCB opposite the electronic components includes a thermally conductive layer 68. The thermally conductive layer 68 conducts heat from the electronic components on the PCB to the thermally conductive pins 64, either via the PCB material or directly by vias embedded in the PCB and connecting the electronics component directly with the thermally conductive layer 68.

Similarly to the previous embodiment, the cooling system 40 includes the nozzle array 48 having the plurality of jet nozzles 60. Each jet nozzle 60 has at least one deflection plate or deflecting structure 62 that deflects to open and close the nozzle. Each deflection plate/structure is in thermal contact with at least one thermally conductive pin 64. The nozzles open and close comparably as in the embodiment of FIG. 3. Again, hotter pins 64*a* of the pins 64 are shown darkened relative to cooler pins 64*b* of the pins 64. The darkened, hotter pins have achieved a temperature $T_1$ above the threshold temperature $T_0$ for deflection or deformation of the bimetallic or other thermally sensitive material (e.g., memory shape alloy/polymer) of the deflection plates/structures 62. In the case of back side cooling, the heat of the electronic components is conducted via the PCB and/or PCB vias through both a thermally conductive layer 68 and the darkened pins 64*a* to the respective deflection plates/structures 62, until the deflection plates likewise achieve the higher temperature $T_1$. This causes the deflection plates to deform, thereby opening the nozzle to permit fluid to flow from the fluid flow path 54 to impinge upon the thermally conductive layer 68, which cools the adjacent electronic components. The impinging flow removes heat from the PCB in the area of the excessively hot electronic components. In contrast, significant heating of the lighter pins 64*b* has not occurred, and the respective deflection plates/structures associated with the lighter pins have not deflected. The respective nozzles associated with the cooler pins 64*b*, therefore, are closed.

In addition, in back side cooling the height of the individual electronic components is not a factor. Accordingly, in the back side configuration the pins 64 need not be moveable for the installation. Instead, the pins 64 may be fixed to the inner plate 50 so as to extend a common distance between the inner plate 50 and the thermally conductive layer. No shortening of the pins after installation is required in this case.

Figure 6:
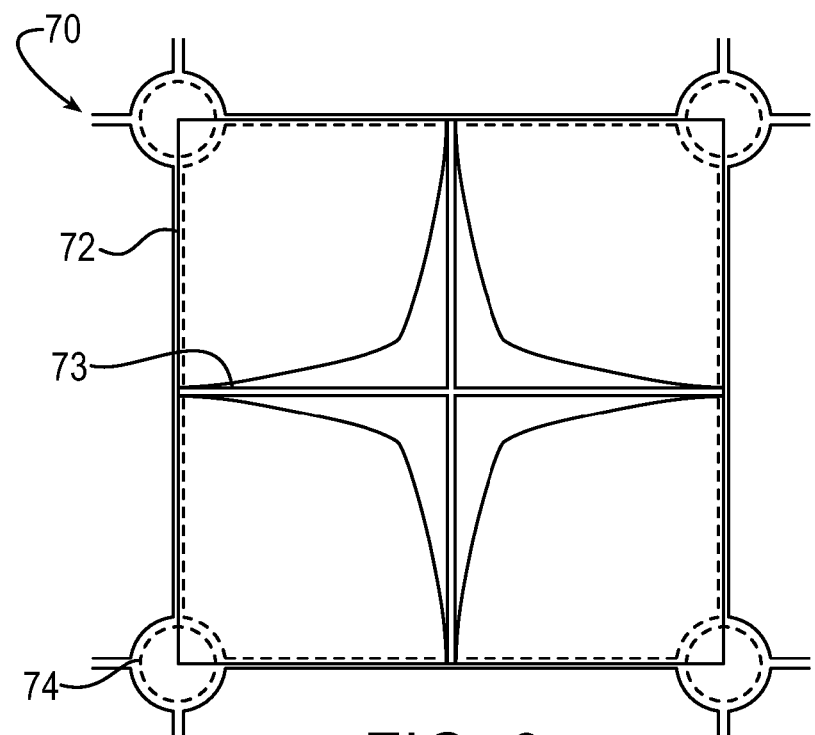
FIG. 6 depicts a top view of an exemplary configuration of a 'Stoma'-type single jet nozzle in accordance with embodiments of the present invention.
Figure 7:
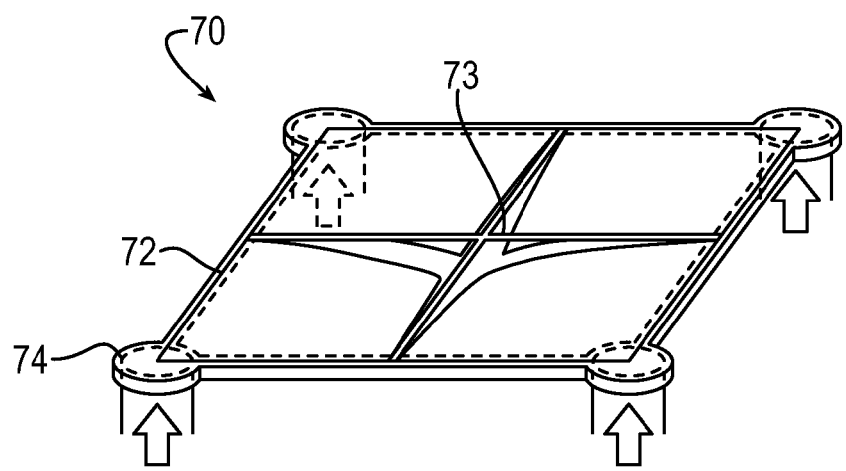
FIG. 7 depicts an isometric view of the exemplary jet nozzle element of FIG. 6.

FIGS. 6-9 depict an exemplary configuration of a single jet nozzle 70 and elements thereof, an array of which may be employed as the nozzle array 48 in the above embodiments. Specifically, in the depicted configuration and in contrast to FIGS. 3-5, the nozzle deflection plates/structures 72 in FIGS. 6 and 7 are in the same plane as the inner plate 50 in FIGS. 3-5, which is now represented by the frame structure 73 in FIGS. 6 and 7. This results in an overall more compact design, as long as the distance between inner plate 50 in FIGS. 3 and 5, or frame 73 in FIGS. 6 and 7, is adjusted to maintain the needed distance from the electronics components for efficient impingement cooling.

Figure 8:
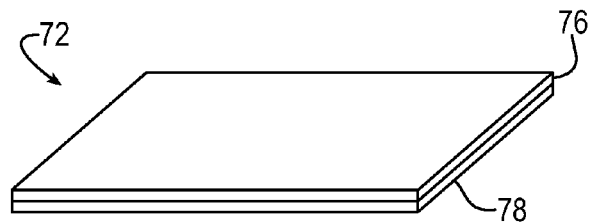
FIG. 8 depicts an isometric view of an isolated deflection plate that may be incorporated into the jet nozzle element of FIGS. 6 and 7.
Figure 9:
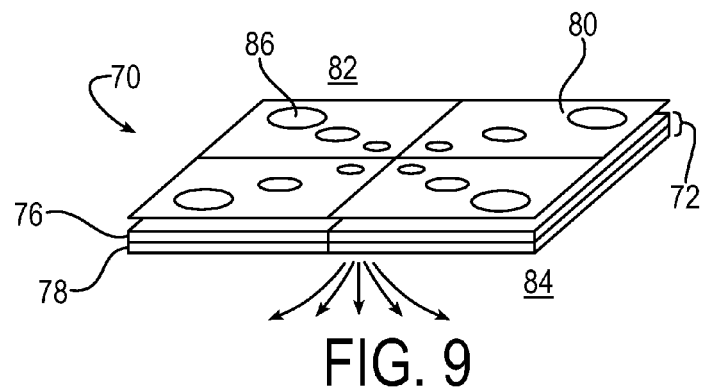
FIG. 9 depicts an isometric view of a portion of an exemplary cover plate that may be utilized in combination with the nozzle (jet) element of FIGS. 6 and 7.

FIG. 6 depicts a top view of the exemplary configuration of the single jet nozzle in accordance with embodiments of the present invention. FIG. 7 depicts an isometric view of the exemplary jet nozzle of FIG. 6. FIG. 8 depicts an isometric view of an isolated deflection plate that may be incorporated into the jet nozzle of FIGS. 6 and 7. FIG. 9 depicts an isometric view of a portion of an exemplary cover plate that may be utilized in combination with the jet nozzle of FIGS. 6 and 7 and that can be an integral part of the frame structure 73 in FIGS. 6 and 7.

Referring to FIGS. 6 and 7, the jet nozzle 70 includes a plurality of deflection plates 72. In FIG. 6, the deflection plates are in the closed position, with the dotted lines indicating the deflection of the plates in the open position. In the close position, edges of the deflection plates essentially meet or may overlap slightly with the mounting frame structure 73, so as to close the nozzle. The frame structure 73 may further incorporate elements which interface with the deflection plates 72 to provide a seal when the nozzle is in the closed position. The isometric view of FIG. 7 depicts the configuration of the nozzle and deflection plates 72 in the open position. In this embodiment of FIGS. 6 and 7, the nozzle element is in thermal contact with four conduction pins 74. Heat flows through the pins 74 from the electronic components of a PCB as described previously and shown by the arrows in FIG. 7 and either directly or via the frame structure 73 to the deflection plates 72. When the temperature of the deflection plates 72 reaches above a threshold temperature based on the transfer of heat from the pins 74, the deflection plates deflect from the closed position in FIG. 6 to the open position in FIG. 7.

FIG. 8 depicts a single one of the deflection plates 72 that may be used in the nozzle element 70 of this embodiment. Each deflection plate 72 may be a bimetallic material including a first layer 76 having a first thermal expansion coefficient, and a second layer 78 having a second thermal expansion coefficient different from the first thermal expansion coefficient. In this example, the first thermal expansion coefficient is high relative to the second high thermal expansion coefficient, which causes the deflection plate to deflect downward as shown in FIG. 7. The relative values of the thermal expansion coefficients may be reversed as well, in which case the deflection plate would deflect upwards. The top surface of the first layer 76 can be made of thermally insulating material in order to minimize heat transfer from the deflection plate to the cooling fluid above.

FIG. 9 depicts an additional nozzle cover plate 80 atop of the deflection plates 72 which are part of the nozzle element 70 already shown in FIGS. 6 and 7. The cover plate 80 can be part of the frame structure 73 in FIGS. 6 and 7, or the inner plate 50 in FIGS. 3 and 5. The cover plate 80 is provided on a cooling fluid side 82 that is opposite an electronic component side 84 of the nozzle element 70. The cover plate 80 can be made of thermally insulating material in order to minimize heat transfer from the deflection plates to the cooling fluid above. The similar insulation material can be applied to the frame structure 73, specifically above the cap material which sits on-top of the pins 64 providing for a thermal path from the pin ends to the deflection plates as shown in FIG. 7. The cover plate may include a plurality of openings 86 through which the cooling fluid may flow/discharge when the deflection plates deform. As indicated by the streamlines, when the nozzle element 70 opens as described above, cooling fluid flows from the cooling fluid side 82, through the cover plate 80 and open nozzle element 70, to the electronic component side 84 to impinge upon the heated electronic components.

Figure 10:
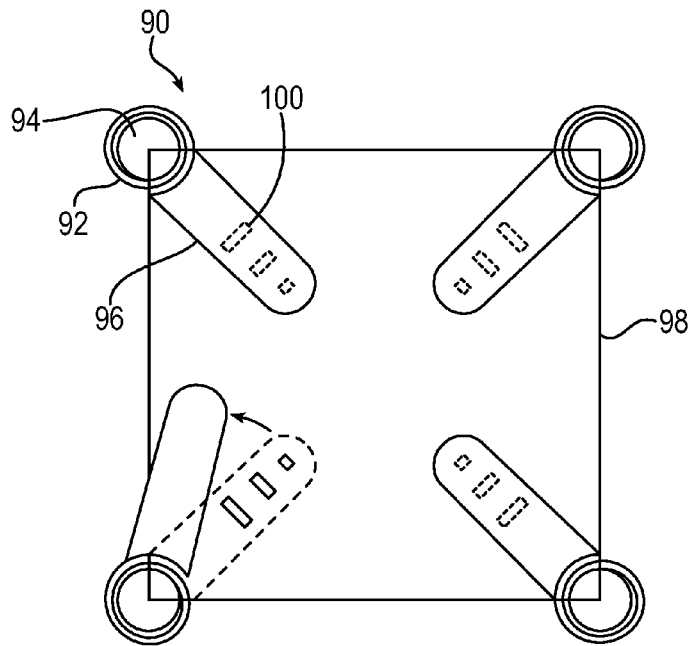
FIG. 10 depicts a top view of another exemplary configuration of a single nozzle or jet element in accordance with embodiments of the present invention.

FIG. 10 depicts a bottom view (with cooling fluid on top) of another exemplary configuration of a single jet nozzle 90, an array of which may be employed as the nozzle array 48 in the above embodiment where the jet nozzle deflection plates/structures are in plane with the inner plate 50 in FIGS. 3 and 5. In this embodiment, deflection elements 92 are in thermal contact with thermally conductive pins 94. Further in this embodiment, the deflection elements 92 are configured as spirals of a shape memory alloy/polymer material of a suitably high thermal expansion coefficient wrapped around the end of the conductive pins near the cover plate 50 or frame structure 73, and being in direct thermal contact with the conductive pins 94, such that when the shape memory alloy/polymer reaches a temperature $T_1$ above a threshold temperature $T_0$, the alloy/polymer deflects by essentially rotating about a center axis of the spiral. The spiral deflection elements 92 are connected to moveable extension plates 96. The jet nozzle element 90 further includes a control plate 98, similar to the cover plate 80 of the arrangement shown in FIG. 9, including a plurality of slots or openings 100. The control plate 98 can be an integral part of the inner plate 50 in FIGS. 3 and 5 and both can be covered with a thermally insulating material on the side facing the cooling fluid. When a given one of the spiral defection elements 92 deflects as described above, such deflection moves or rotates a respective one of the extension plates 96 in the plane of the control plate 98 from a closed position to an open position. When in the open position, one or more of the slots 100 becomes exposed, thereby permitting cooling fluid to pass through the nozzle element to impinge upon a heated electronic component.

In the example of FIG. 10, four sets of combined deflection element 92, thermally conductive pin 94, and extension plate 96 are shown. The lower left of the deflection elements has been heated by heat conducted via the lower left of the pins 94. Accordingly, the spiral material of the lower left deflection element has deflected to cause the respective one of the extension plates 96 to rotate counterclockwise to the open position. In such open position, slots that previously had been covered by the extension plate are now exposed to permit the through passage of cooling fluid. The other three of the deflection elements in this example (upper left; upper and lower right) have not been sufficiently heated, and thus the respective extension plates remain in the closed position, thereby sealing their respective slots from the passage of cooling fluid. It will be appreciated that although four sets of nozzle elements are shown in FIG. 10, the precise number and orientation of such nozzle elements may be varied.

Figure 11A:
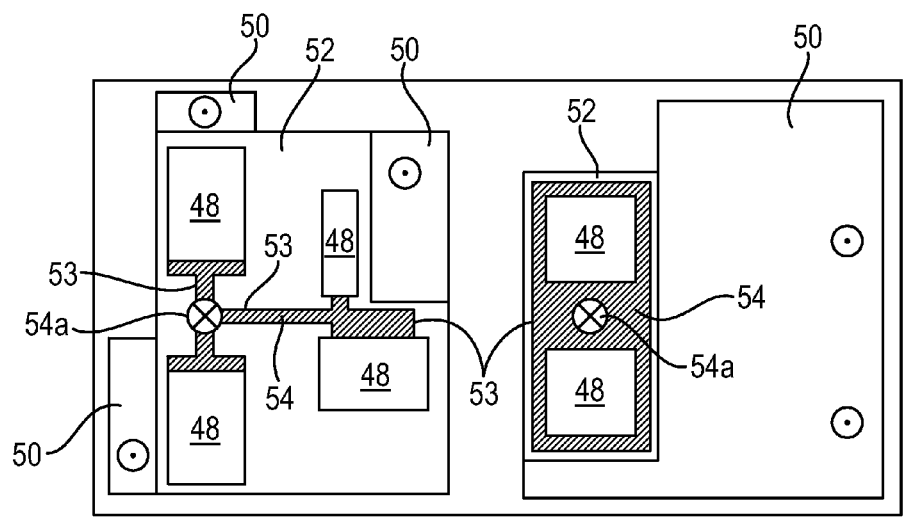
FIGS. 11A-B depict exemplary configurations for inflow and outflow channel routing for the impingement jet cooling system.
Figure 11B:
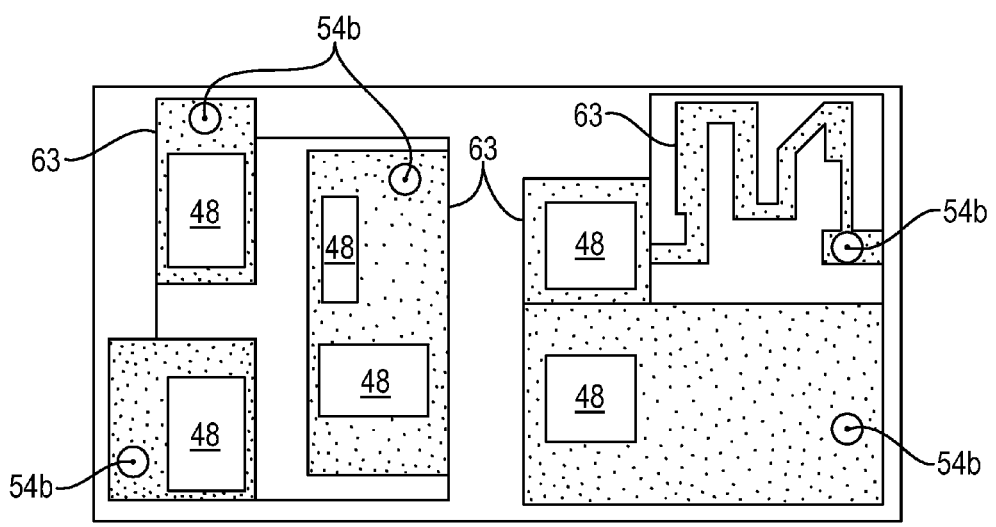

FIG. 11A depicts a top view of an exemplary inlet channel routing with channel walls 53, creating the inlet flow path 54. FIG. 11B depicts a top view of an exemplary exit channel routing with channel walls 63 that differs from the inlet channel routing and based on whether the discharging fluid provides for additional convective cooling of electronics components after providing impingement cooling. FIGS. 11A-B also illustrate inlet 54a and outlet 54b connections for the inlet and outlet flows. FIGS. 11A-B furthermore illustrate that the extend/footprint of inner plate 50 can be larger than the cover plate 52 in order to accommodate outlet(s) 54b without having to penetrate the inlet flow path 54.

Figure 12:
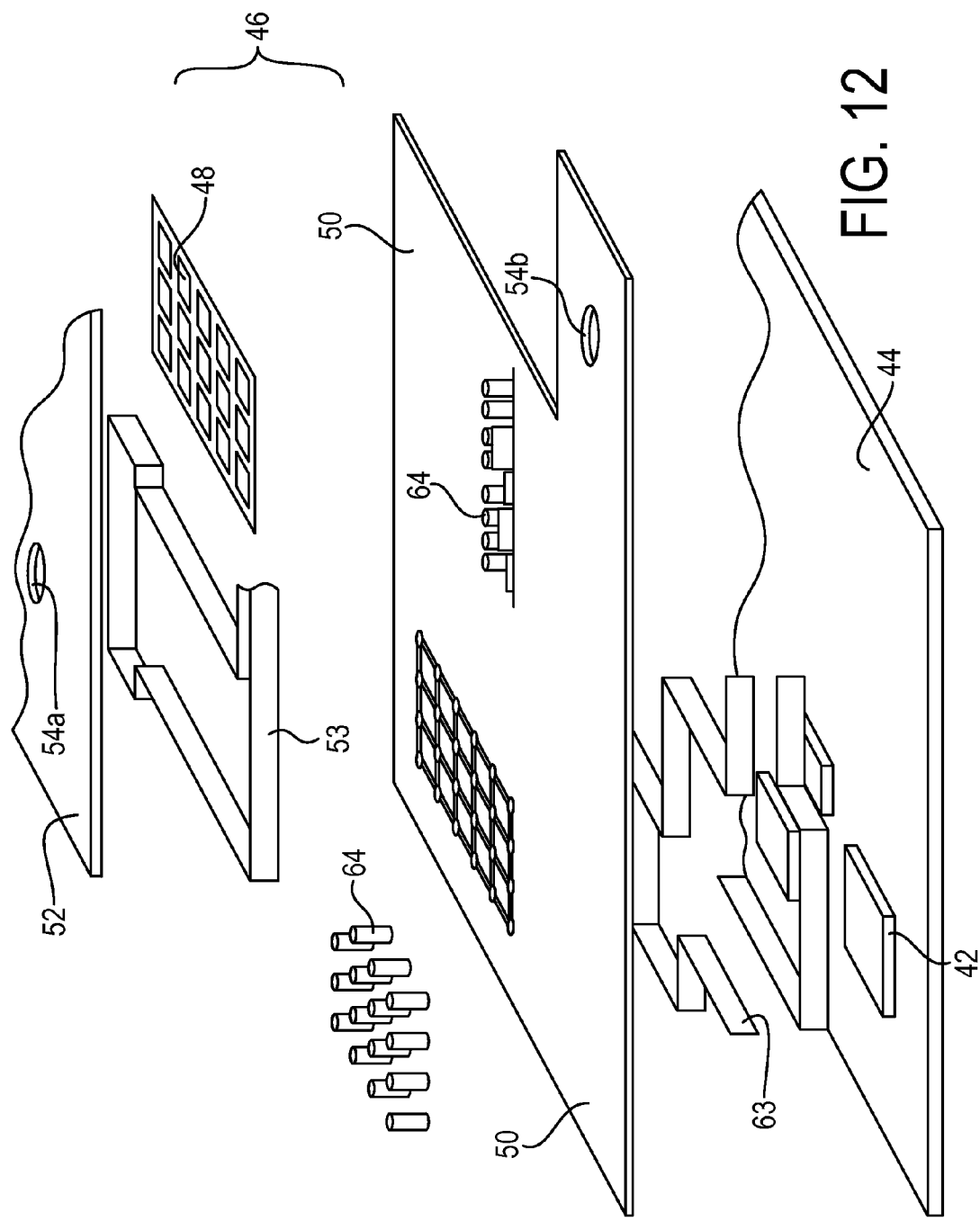
FIG. 12 is a schematic diagram depicting on how the major components of the impingement cooling system are assembled.

FIG. 12 depicts an assembly drawing showing the major components of the impingement cooling system providing for insight in one possible way to assemble the impingement cooling system: (1) Discharge channel walls 63 are being placed and affixed to the PCB board. (2) Inner plate 50 together with movable pins 64 is placed on top of the channel walls 63. (3) Pins 64 are locked in place with respect to the inner plate 50 after assuring good thermal contact of pins 64 with electronics components 42 of PCB 44. (4) Subassembly consisting of inner plate 50 with locked pins 64 is removed, excess pin material is removed and good thermal contact between pin center and inner plate 50 is established. (5) Nozzle array 48 is installed on removed subassembly assuring good direct thermal contact with pins 64 or good indirect thermal contact with the pins 64 via inner plate 50. (6) Subassembly is reinstalled atop of PCB 44 and channel walls 63. (7) Inflow channel walls 53 are being placed and affixed to the inner plate 50. (8) The cover plate with inlet flow access ports 54a is installed atop the inflow channel walls 53. Note that additional tightening bolts or spacers 58b or 58 might be installed between PCB and inner plate 50 or between inner plate 50 and cover plate 52, respectively In accordance with the above description, an aspect of the invention is an impingement cooling system for cooling electronic components. In exemplary embodiments, the impingement cooling system includes a nozzle array including a plurality of nozzles that are in fluid communication with a source of cooling fluid, each nozzle comprising at least one deflection structure that deforms above a threshold temperature, and a plurality of thermally conductive pins respectively in thermal contact with the deflection structures of the plurality of nozzles that conduct heat from at least one of the electronic components to the deflection structures of the nozzles. When a heated nozzle within the nozzle array reaches a temperature above the threshold temperature due to heat conducted from the respective thermally conductive pin to the deflection structure of the heated nozzle, the deflection structure of the heated nozzle deforms from a closed position to an open position to permit cooling fluid to impinge upon the at least one of the electronic components.

In an exemplary embodiment of the impingement cooling system, the deflection structure comprises at least one deflection plate/component that deforms above the threshold temperature.

In an exemplary embodiment of the impingement cooling system, the deflection plate/component is in thermal contact with at least one thermally conductive pin.

In an exemplary embodiment of the impingement cooling system, the impingement cooling system further includes a nozzle cover plate having a plurality of openings through which cooling fluid may flow when the deflection structures deform from the closed position to the open position.

In an exemplary embodiment of the impingement cooling system, the thermally conductive pins each comprises an inner thermally conductive material surrounded by a thermally insulating layer.

In an exemplary embodiment of the impingement cooling system, the impingement cooling system further includes an injector plate. The injector plate includes the nozzle array, and an inner plate spaced apart from the nozzle array and that retains the thermally conductive pins. The thermally conductive pins are moveable relative to the inner plate to adjust to heights of respective electronic components in thermal contact with the thermally conductive pins during the installation process.

In an exemplary embodiment of the impingement cooling system, the impingement cooling system further includes an injector plate. The injector plate includes a nozzle array, and an inner plate co-planar with the nozzle array and that retains the thermally conductive pins. The thermally conductive pins are moveable relative to the inner plate to adjust to heights of respective electronic components in thermal contact with the thermally conductive pins during the installation process.

In an exemplary embodiment of the impingement cooling system, the impingement system further includes a thermally conductive layer that conducts heats from the electronic components to the thermally conductive pins.

In an exemplary embodiment of the impingement cooling system, the thermally conductive layer is impermeable to the cooling fluid.

In an exemplary embodiment of the impingement cooling system, the impingement cooling system further includes a cover plate, wherein the nozzle array and the cover plate define a fluid flow path that provides an inlet for the cooling fluid to flow to the nozzles of the nozzle array.

In an exemplary embodiment of the impingement cooling system, the conductive pins terminate at the nozzle cover plate and do not protrude into the inlet flow path.

In an exemplary embodiment of the impingement cooling system, at least part of the deflection structures are formed of a bimetallic material comprising a first metallic layer having a first thermal expansion coefficient, and a second metallic layer having a second thermal expansion coefficient that is different from the first thermal expansion coefficient.

In an exemplary embodiment of the impingement cooling system, the deflection structures are formed of a shape memory metal alloy or shape memory polymer which is temperature responsive.

In an exemplary embodiment of the impingement cooling system, when a heated nozzle within the nozzle array cools to a temperature below the threshold temperature, the deflection structure of the heated nozzle returns to the closed position.

Another aspect of the invention is a second impingement cooling system for cooling electronic components. In exemplary embodiments, the second impingement cooling system includes a nozzle array including a plurality of nozzles that are in fluid communication with a source of cooling fluid, each nozzle comprising a deflection structure that deforms above a threshold temperature, and an extension plate connected to the deflection structure that moves when the deflection structure deforms; and a plurality of thermally conductive pins respectively in thermal contact with the deflection structures of the plurality of nozzles that conduct heat from at least one of the electronic components to the deflection structures of the nozzles. When a heated nozzle within the nozzle array reaches a temperature above the threshold temperature due to heat conducted from the respective thermally conductive pin to the deflection structure of the heated nozzle, the deflection structure of the heated nozzle deforms to move the extension plate of the heated nozzle from a closed position to an open position to permit cooling fluid to impinge upon the at least one of the electronic components.

In an exemplary embodiment of the second impingement cooling system, the deflection structure comprises a spiral deflection element of a shape memory alloy or polymer material, or bimetallic strip.

In an exemplary embodiment of the second impingement cooling system, the spiral deflection element of the heated nozzle deforms above the threshold temperature about a center axis to rotate the extension plate of the heated nozzle from the closed position to the open position.

In an exemplary embodiment of the impingement cooling system, the second impingement cooling system further includes a control plate adjacent the nozzle array and including a plurality of openings adjacent the nozzles, wherein when the extension plate of the heated nozzle moves from the closed position to the open position, cooling fluid is permitted to pass through at least one of the openings of the control plate to impinge upon the respective electronic component.

In an exemplary embodiment of the impingement cooling system, the control plate adjacent to the nozzle is made of thermally insulating material Another aspect of the inventions is an electronics component system. In exemplary embodiments, the electronics component system includes a circuit board having at least one electronic component mounted thereon, and an impingement cooling system. The impingement cooling system includes a nozzle array including a plurality of nozzles that are in fluid communication with a source of cooling fluid, each nozzle comprising at least one deflection structure that deforms above a threshold temperature; and a plurality of thermally conductive pins respectively in thermal contact with the deflection structures of the plurality of nozzles that conduct heat from at least one of the electronic components to the deflection structures of the nozzles. When a heated nozzle within the nozzle array reaches a temperature above the threshold temperature due to heat conducted from the respective thermally conductive pin to the deflection structure of the heated nozzle, the deflection structure of the heated nozzle deforms from a closed position to an open position to permit cooling fluid to impinge upon the at least one of the electronic components.

In an exemplary embodiment of the electronics component system, the impingement cooling system further includes an injector plate. The injector plate includes the nozzle array, and an inner plate spaced apart from the nozzle array and that retains the thermally conductive pins, wherein the thermally conductive pins are moveable relative to the inner plate to adjust to heights of respective electronic components in thermal contact with the thermally conductive pins.

In an exemplary embodiment of the electronics component system, the impingement cooling system further includes an injector plate. The injector plate includes the nozzle array, and an inner plate co-planar with the nozzle array and that retains the thermally conductive pins, wherein the thermally conductive pins are moveable relative to the inner plate to adjust to heights of respective electronic components in thermal contact with the thermally conductive pins.

In an exemplary embodiment of the electronics component system, the impingement cooling system further comprises a thermally conductive layer that conducts heats from the electronic components to the thermally conductive pins.

In an exemplary embodiment of the electronics component system, the deflection structure comprises at least one deflection plate formed of shape memory alloy or polymer which is temperature sensitive, or a bimetallic material comprising a first metallic layer having a first thermal expansion coefficient and a second metallic layer having a second thermal expansion coefficient that is different from the first thermal expansion coefficient.

In an exemplary embodiment of the electronics component system, the electronics component system further includes a feed channel delivering fluid to the nozzles having one geometric configuration, and a discharge channel discharging fluid from the nozzles having a second geometric configuration.

In an exemplary embodiment of the electronics component system, the geometric configuration of the discharge channel is such that, after impingement cooling, the discharging fluid provides additional convective cooling to electronic components which have not participated in impingement cooling.

Although the invention has been shown and described with respect to certain preferred embodiments, it is understood that equivalents and modifications will occur to others skilled in the art upon the reading and understanding of the specification. For example, the pins 64 themselves could be made of a thermally responsive two-way shape memory alloy, which deform when heated and which are coupled with the nozzle elements triggering opening and closing of said nozzles. The present invention includes all such equivalents and modifications, and is limited only by the scope of the following claims.

What is claimed is:

1. An impingement cooling system for cooling electronic components, the impingement cooling system comprising:
   a nozzle array including a plurality of nozzles that are in fluid communication with a source of cooling fluid, each nozzle comprising at least one deflection structure that deforms above a threshold temperature; and
   a plurality of thermally conductive pins respectively in thermal contact with the deflection structures of the plurality of nozzles that conduct heat from at least one of the electronic components to the deflection structures of the nozzles;
   wherein when a heated nozzle within the nozzle array reaches a temperature above the threshold temperature due to heat conducted from the respective thermally conductive pin to the deflection structure of the heated nozzle, the deflection structure of the heated nozzle deforms from a closed position to an open position to permit cooling fluid to impinge upon the at least one of the electronic components.

2. The impingement cooling system of claim 1, wherein the deflection structure comprises at least one deflection plate/component that deforms above the threshold temperature.

3. The impingement cooling system of claim 2, wherein the deflection plate/component is in thermal contact with at least one thermally conductive pin.

4. The impingement cooling system of claim 1, further comprising a nozzle cover plate having a plurality of openings through which cooling fluid may flow when the deflection structures deform from the closed position to the open position.

5. The impingement cooling system of claim 1, wherein the thermally conductive pins each comprises an inner thermally conductive material surrounded by a thermally insulating layer.

6. The impingement cooling system of claim 1, further comprising an injector plate, the injector plate comprising:
   the nozzle array; and
   an inner plate spaced apart from the nozzle array and that retains the thermally conductive pins, wherein the thermally conductive pins are moveable relative to the inner plate to adjust to heights of respective electronic components in thermal contact with the thermally conductive pins during the installation process.

7. The impingement cooling system of claim 1, further comprising an injector plate, the injector plate comprising:
   a nozzle array; and
   an inner plate co-planar with the nozzle array and that retains the thermally conductive pins, wherein the thermally conductive pins are moveable relative to the inner plate to adjust to heights of respective electronic components in thermal contact with the thermally conductive pins during the installation process.

8. The impingement cooling system of claim 1, further comprising a thermally conductive layer that conducts heats from the electronic components to the thermally conductive pins.

9. The impingement cooling system of claim 8, wherein the thermally conductive layer is impermeable to the cooling fluid.

10. The impingement cooling system of claim 1, further comprising a cover plate, wherein the nozzle array and the cover plate define a fluid flow path that provides an inlet for the cooling fluid to flow to the nozzles of the nozzle array.

11. The impingement cooling system of claim 1, whereby the conductive pins terminate at the nozzle cover plate and do not protrude into the inlet flow path.

12. The impingement cooling system of claim 1, wherein at least part of the deflection structures are formed of a bimetallic material comprising a first metallic layer having a first thermal expansion coefficient, and a second metallic layer having a second thermal expansion coefficient that is different from the first thermal expansion coefficient.

13. The impingement cooling system of claim 1, wherein the deflection structures are formed of a shape memory metal alloy or shape memory polymer which is temperature responsive.

14. The impingement cooling system of claim 1, wherein when a heated nozzle within the nozzle array cools to a temperature below the threshold temperature, the deflection structure of the heated nozzle returns to the closed position.

15. An impingement cooling system for cooling electronic components, the impingement cooling system comprising:
   a nozzle array including a plurality of nozzles that are in fluid communication with a source of cooling fluid, each nozzle comprising a deflection structure that deforms above a threshold temperature, and an extension plate connected to the deflection structure that moves when the deflection structure deforms; and
   a plurality of thermally conductive pins respectively in thermal contact with the deflection structures of the plurality of nozzles that conduct heat from at least one of the electronic components to the deflection structures of the nozzles;
   wherein when a heated nozzle within the nozzle array reaches a temperature above the threshold temperature due to heat conducted from the respective thermally conductive pin to the deflection structure of the heated nozzle, the deflection structure of the heated nozzle deforms to move the extension plate of the heated nozzle from a closed position to an open position to permit cooling fluid to impinge upon the at least one of the electronic components.

16. The impingement cooling system of claim 15, wherein the deflection structure comprises a spiral deflection element of a shape memory alloy or polymer material, or bimetallic strip.

17. The impingement cooling system of claim 16, wherein the spiral deflection element of the heated nozzle deforms above the threshold temperature about a center axis to rotate the extension plate of the heated nozzle from the closed position to the open position.

18. The impingement system of claim 15, further comprising a control plate adjacent the nozzle array and including a plurality of openings adjacent the nozzles, wherein when the extension plate of the heated nozzle moves from the closed position to the open position, cooling fluid is permitted to pass through at least one of the openings of the control plate to impinge upon the respective electronic component.

19. The impingement system of claim 18, wherein the control plate adjacent to the nozzle is made of thermally insulating material.

20. An electronics component system comprising:
a circuit board having at least one electronic component mounted thereon; and
an impingement cooling system;
wherein the impingement cooling system comprises:
a nozzle array including a plurality of nozzles that are in fluid communication with a source of cooling fluid, each nozzle comprising at least one deflection structure that deforms above a threshold temperature; and
a plurality of thermally conductive pins respectively in thermal contact with the deflection structures of the plurality of nozzles that conduct heat from at least one of the electronic components to the deflection structures of the nozzles;
wherein when a heated nozzle within the nozzle array reaches a temperature above the threshold temperature due to heat conducted from the respective thermally conductive pin to the deflection structure of the heated nozzle, the deflection structure of the heated nozzle deforms from a closed position to an open position to permit cooling fluid to impinge upon the at least one of the electronic components.

21. The electronics component system of claim 20, wherein the impingement cooling system further comprises an injector plate;
the injector plate comprising:
the nozzle array; and
an inner plate spaced apart from the nozzle array and that retains the thermally conductive pins, wherein the thermally conductive pins are moveable relative to the inner plate to adjust to heights of respective electronic components in thermal contact with the thermally conductive pins.

22. The electronics component system of claim 20, wherein the impingement cooling system further comprises an injector plate;
the injector plate comprising:
the nozzle array; and
an inner plate co-planar with the nozzle array and that retains the thermally conductive pins, wherein the thermally conductive pins are moveable relative to the inner plate to adjust to heights of respective electronic components in thermal contact with the thermally conductive pins.

23. The electronics component system of claim 20, wherein the impingement cooling system further comprises a thermally conductive layer that conducts heats from the electronic components to the thermally conductive pins.

24. The electronics component system of claim 20, wherein the deflection structure comprises at least one deflection plate formed of shape memory alloy or polymer which is temperature sensitive, or a bimetallic material comprising a first metallic layer having a first thermal expansion coefficient and a second metallic layer having a second thermal expansion coefficient that is different from the first thermal expansion coefficient.

25. The electronics component system of claim 20, further comprising a feed channel delivering fluid to the nozzles having one geometric configuration, and a discharge channel discharging fluid from the nozzles having a second geometric configuration.

26. The electronics component system of claim 25, wherein the geometric configuration of the discharge channel is such that, after impingement cooling, the discharging fluid provides additional convective cooling to electronic components which have not participated in impingement cooling.

* * * * *